United States Patent [19]

Haisty et al.

[11] 3,748,548

[45] July 24, 1973

[54] THREE-DIMENSIONAL INTEGRATED CIRCUITS AND METHOD OF MAKING SAME

[75] Inventors: Robert W. Haisty, Richardson; Rowland E. Johnson; Edward W. Mehol, both of Dallas, all of Tex.

[73] Assignee: Texas Instruments Incorporated, Dallas, Tex.

[22] Filed: Sept. 3, 1971

[21] Appl. No.: 177,812

Related U.S. Application Data

[63] Continuation of Ser. No. 390,298, Aug. 18, 1964, abandoned.

[52] U.S. Cl. ..... 317/235 R, 317/235 D, 317/235 E, 317/235 G, 317/235 AD, 317/235 AC

[51] Int. Cl. .......................................... H01l 19/00

[58] Field of Search .................... 317/235 D, 235 E, 317/235 AD, 235 AC, 235 G

[56] References Cited

UNITED STATES PATENTS

| | | | |
|---|---|---|---|
| 3,260,902 | 7/1966 | Porter | 317/235 |
| 3,372,069 | 3/1968 | Bailey | 148/175 |
| 2,913,632 | 11/1959 | Stanton | 317/101 |
| 3,173,101 | 3/1965 | Stelmak | 330/37 |
| 3,283,160 | 11/1966 | Levitt | 250/213 |
| 3,234,057 | 2/1966 | Anderson | 148/33 |
| 3,229,104 | 1/1966 | Rutz | 253/211 |
| 3,209,214 | 9/1965 | Murphy | 317/234 |
| 3,179,542 | 4/1965 | Quinn | 148/177 |
| 3,270,235 | 8/1966 | Loebner | 313/108 |

*Primary Examiner*—Martin H. Edlow
*Attorney*—Richard L. Donaldson

[57] ABSTRACT

This invention relates to electrical devices, such as semiconductor networks or integrated circuits. More particularly it relates to circuits of the class described in which a plurality of individual circuit component functions are performed by discrete regions and non-discrete regions of function-performing material arranged and operatively interconnected three dimensionally within the structure of a single unit, and to methods of making same.

7 Claims, 11 Drawing Figures

THREE-DIMENSIONAL INTEGRATED CIRCUITS AND METHOD OF MAKING SAME

This is a continuation of application Ser. No. 390,298, filed Aug. 18, 1964 now abandoned.

Integrated circuits are electrical devices generally comprising a plurality of circuit components which perform individual electrical functions, such as those performed, for example, by diodes, transistors, resistors, capacitors, etc., which are fabricated on one surface of small or miniscule crystalline semiconductor wafers and which are interconnected thereon to form an electrical circuit. The term "electrical device," as used herein, includes devices which provide one or more circuit component functions, complete circuit functions, or complete system or network functions.

Devices (e.g., networks) of the conventional two-dimension integrated circuit type have the advantage of significantly smaller size than other types of miniaturized networks, such as printed circuits. However, many of these integrated circuits, as described above, have space or dimensional limitations in that the circuit components are generally formed by selective diffusion of conductivity-affecting impurities into the surface of a substrate wafer and hence can only be formed two dimensionally, i.e., on one side of each semiconductor wafer. Furthermore, since the substrate wafer is generally semiconducting material, special complex techniques must be employed to effect required electrical isolation between the circuit elements fabricated on the substrate.

Heretofore, further reduction in the size of integrated circuit networks has been limited by the surface area of the substrate wafer available for the formation of individual circuit components thereon. Integrated systems comprising a plurality of individual network wafers have been constructed but are still dimensionally limited to the smallest space in which the individual integrated circuit wafers can be positioned while allowing adequate space between wafers for electrical isolation and the making of required electrical interconnections between selected components of each wafer by external electrical leads. It has been difficult to achieve a relatively high density of components or circuit functions by arranging separate integrated circuit wafers in a stack with external leads interconnecting the desired circuit components.

Briefly, the present invention provides an integrated circuit having individual components and/or nondiscrete regions of function-performing material spaced and functionally interconnected both vertically and horizontally through and within the confines of a continuous integral body. Electrical isolation between the functional regions is provided by crystalline insulating or semi-insulating material in the body or "three-dimensional block." By "semi-insulating" material and "insulating" material is meant material which generally has a resistivity at room temperature of about $10^4$ ohm-centimeters or greater, preferably in the range of $10^6$ ohm-centimeters and above. The term "electrically intrinsic" material as used herein refers to semiconductor material which is purely intrinsic and also refers to semiconductor material which has electrical characteristics of purely intrinsic material but is doped with impurities to attain this condition. Furthermore, the term "electrically intrinsic" as used herein also refers to those intrinsic materials which are electrically insulating within the meaning of the term as defined above. A suitable example of such material is semi-insulating gallium arsenide such as that described in a copending U.S. patent application entitled "HIGH RESISTIVITY GALLIUM ARSENIDE AND METHOD FOR MAKING SAME", Ser. No. 311,430, filed Sept. 25, 1963, in the name of George R. Cronin, and assigned to the assignee of the instant application.

It is therefore one object of the present invention to provide an electrical device comprising a body which contains strata of material having means to perform circuit functions, the means of one strata being responsive to the electrical condition of the means in another strata through coupling means disposed entirely within the confines of the body.

Another object of the invention is to provide an electrical device comprising superimposed strata of semiconductor material which contains regions devised to perform circuit functions and having coupling means extending through one of the semiconductor strata thereby to cause regions in one stratum to be responsive to the electrical condition of regions in another stratum.

It is another object to provide a method of producing electrical circuits in a single unit or integral block, said unit or block comprising a plurality of circuit components and/or nondiscrete function-performing regions, said components and regions being arranged and functionally interconnected in all three dimensions within a substantially monocrystalline unit or block of material and otherwise selectively and electrically isolated by electrically intrinsic material.

A further object of the invention is to provide a method of producing miniaturized or so-called microminiature electrical devices of the class described which have a high density of circuit component functions.

A more specific object of the invention is to provide highly compact electrical circuits comprised of a plurality of components within a single body, said components being arranged within said body in a manner as to be electrically isolated from other elements within said body except where electrical interconnection to perform circuit functions is required.

Still another object of the invention is to provide internal connections between circuit components formed within a crystalline unit.

A still further object of the invention is to provide integrated circuits in a single body of material in which the circuit elements are interconnected entirely within the body without the use of external leads.

Another more specific object of the invention is to provide a three-dimensional electronic block formed of electrically intrinsic material, which block inlcudes a plurality of circuit components formed in each of a plurality of spaced strata forming an integral part of the block, selective ones of the components of one strata being operatively interconnected with selected ones of the components in other strata, the interconnections between said components being disposed entirely within the block thereby to provide a miniaturized arrangement with a high density of components and circuit functions within the block.

It is to be understood that the invention is not limited in its application to the details of construction and arrangement of parts illustrated in the accompanying drawings, since the invention is capable of other embodiments and of being practiced or carried out in various ways. Also, it is to be understood that the phraseology or terminology employed herein is for the purpose of description and not of limitation.

These and other objects and advantages of the invention will become more readily understood from the following detailed description, taken in conjunction with the appended claims and attached drawings in which:

Figure 3:
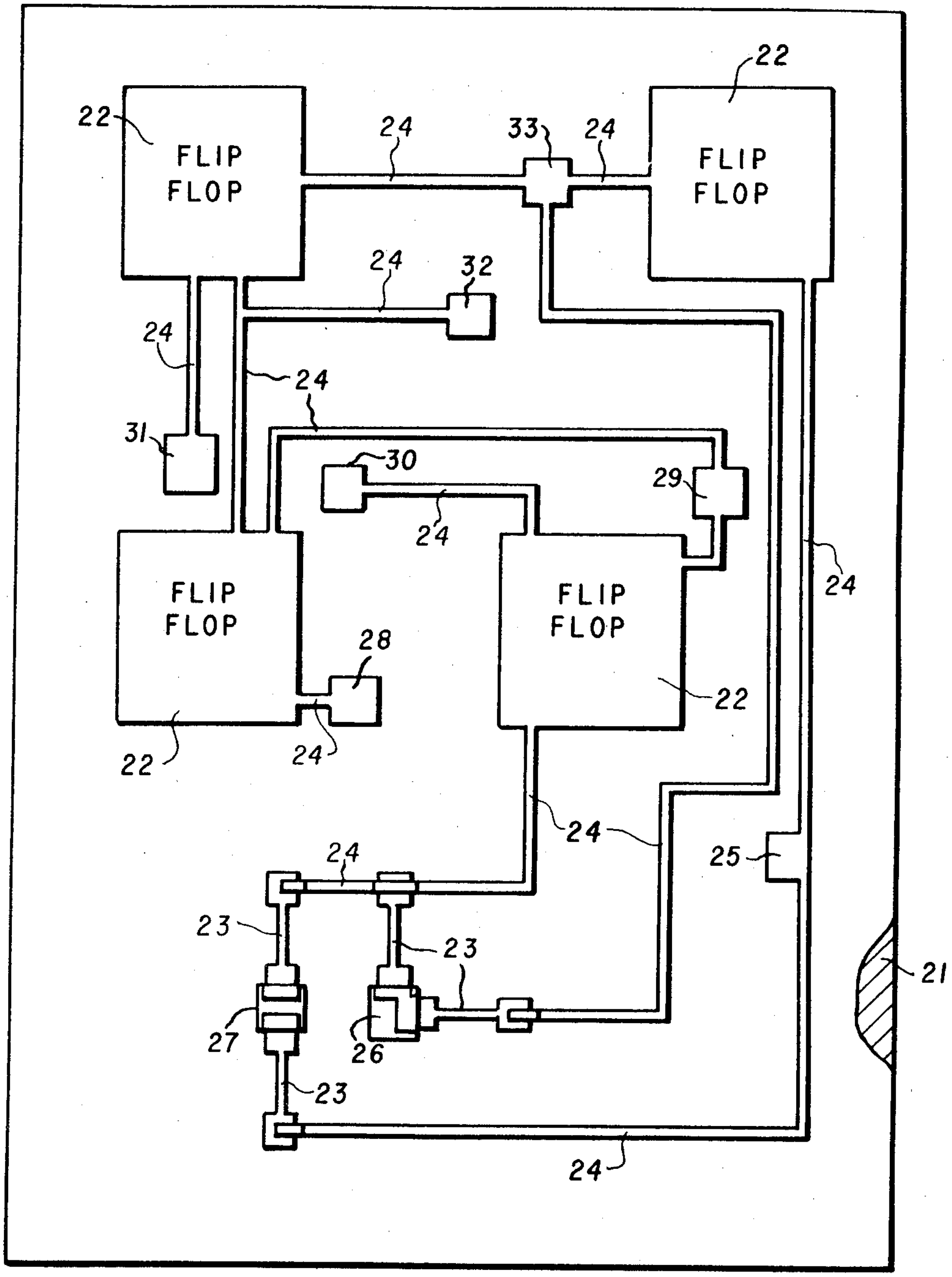
FIG. 3 is a bottom plan view diagrammatically representing an exemplary arrangement of circuit components or circuit function-performing regions on the bottom surface of the wafer of FIG. 2 comprising the first stratum of a partially formed monocrystalline unit according to the specific embodiment to be described hereinbelow.
Figure 4:
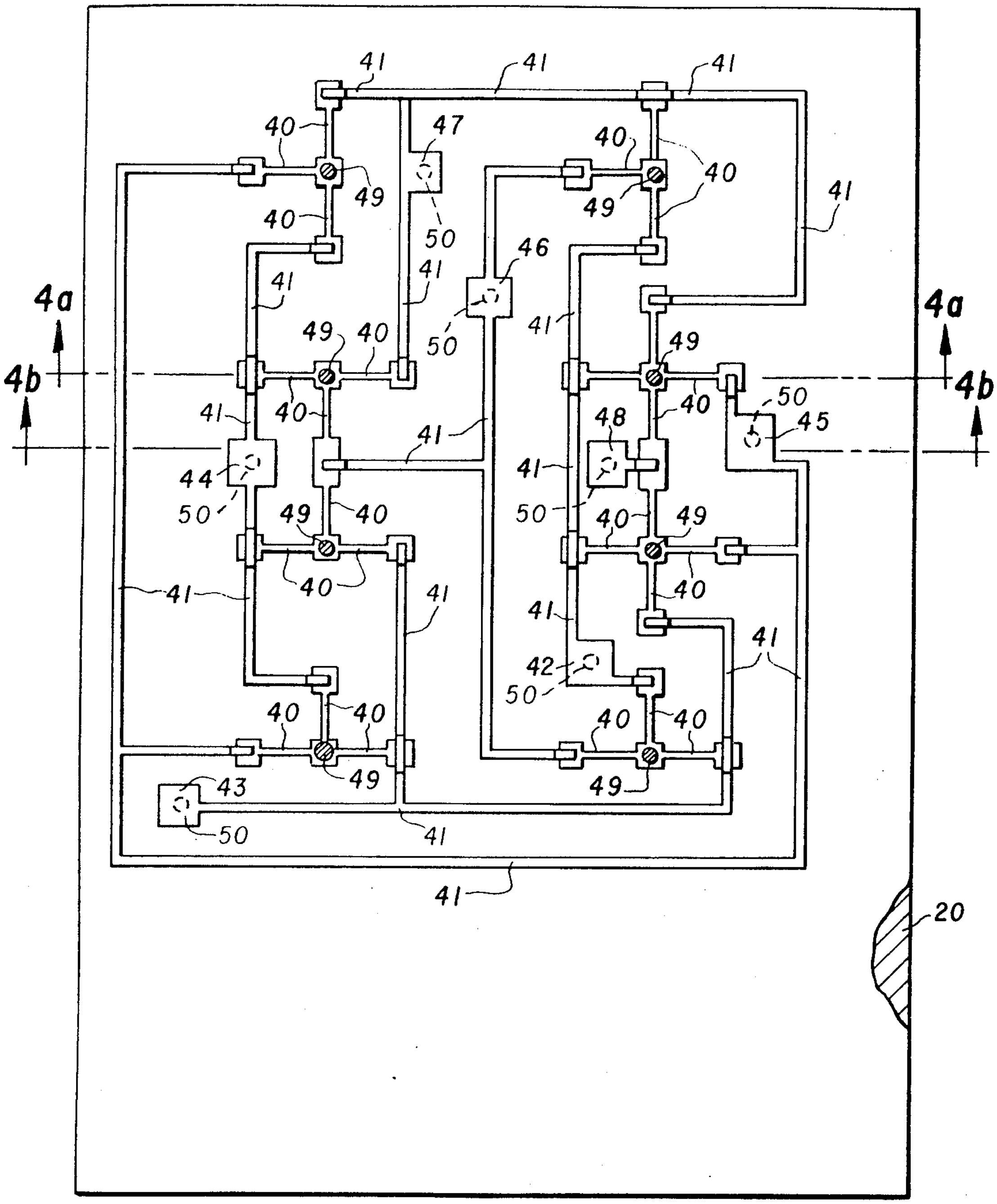
FIG. 4 is a top plan view of the top surface of the wafer of FIG. 2, whereon resistive elements and conductive interconnections have been formed in the second stratum.
Figure 5:
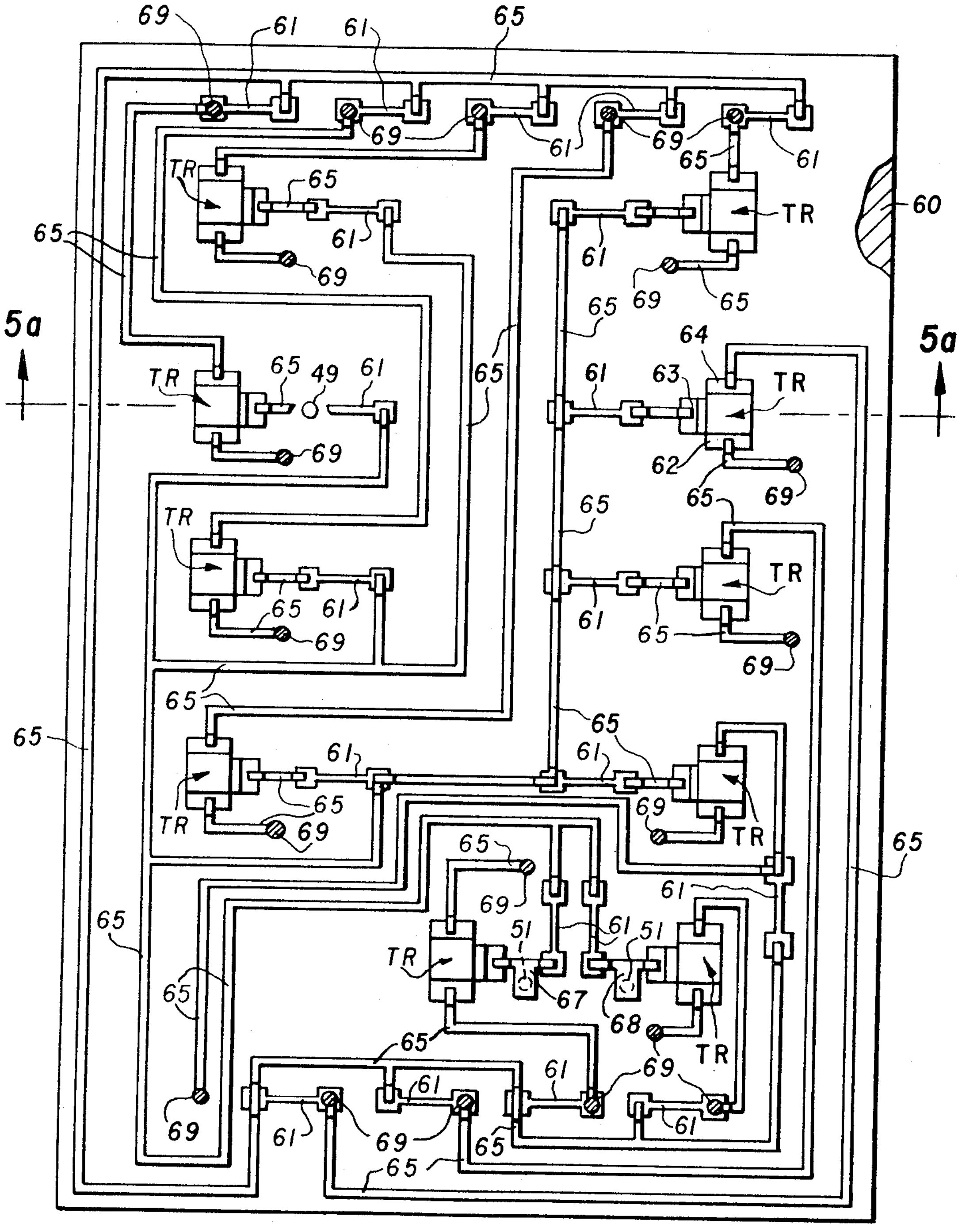
Figure 6:
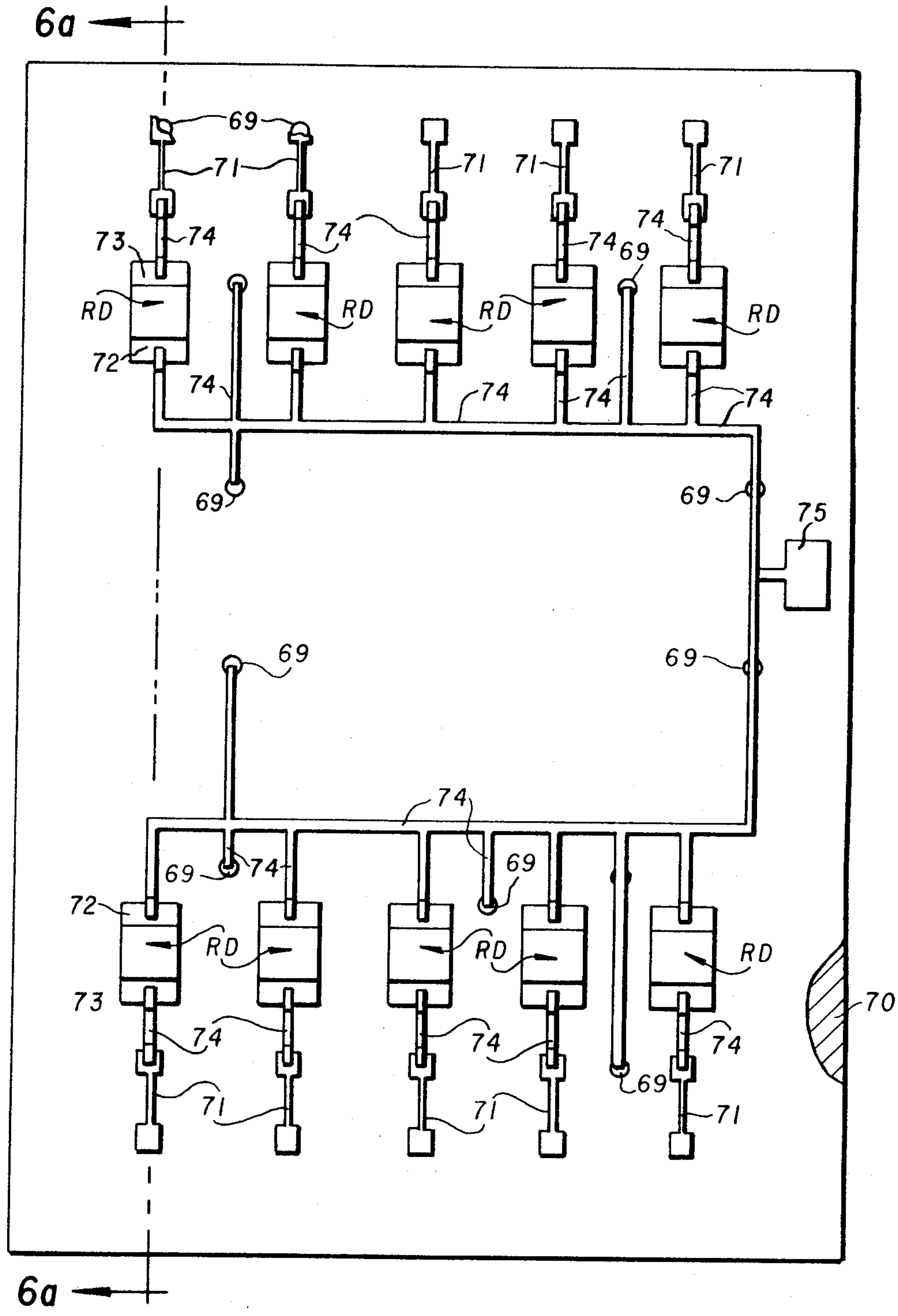
Figure 7:
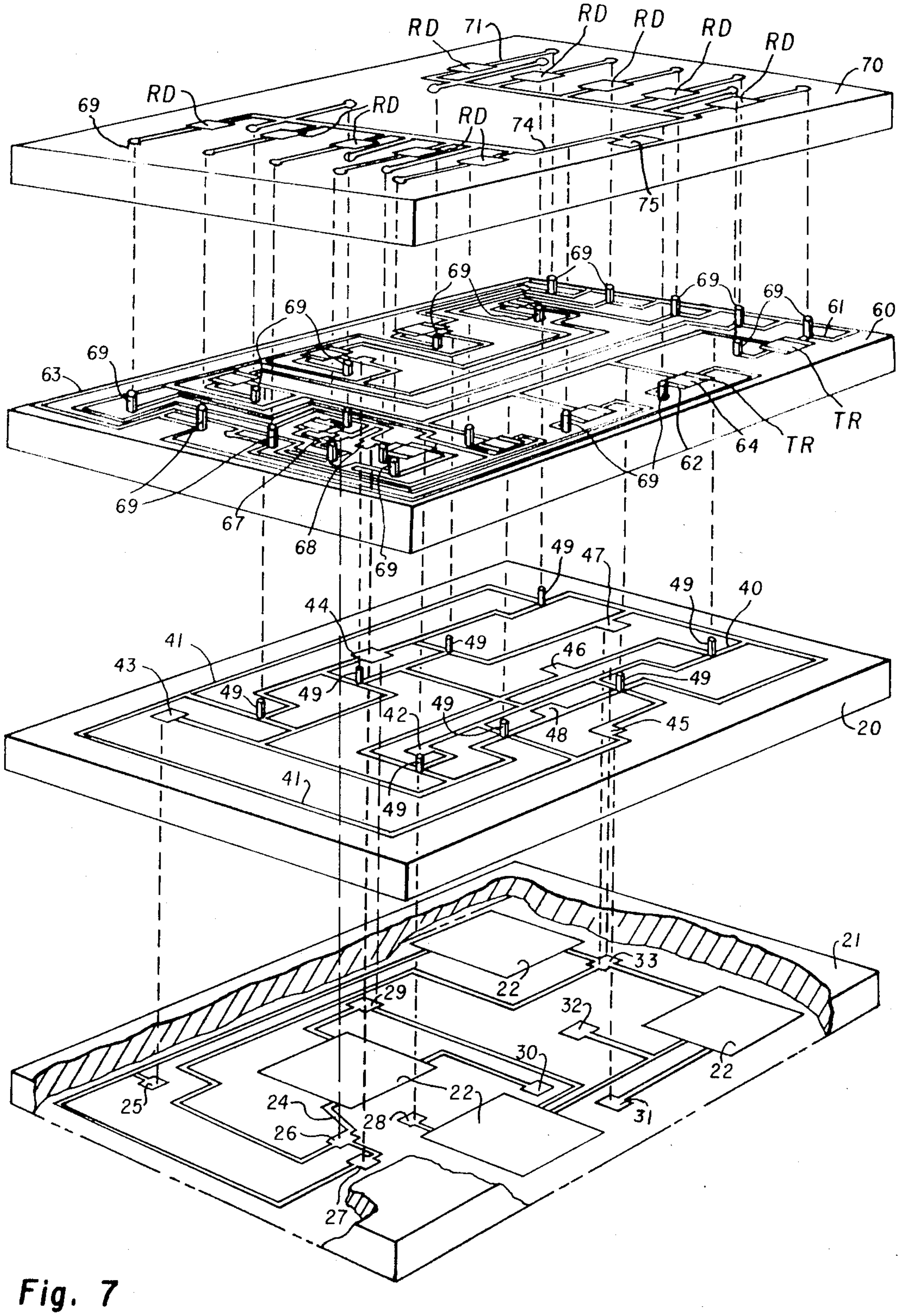

FIGS. *4a* and *4b* are sectional views of the wafer shown in FIGS. 3 and 4 taken through the Lines *4a—4a* and *4b—4b*, respectively, certain parts not along the cross section lines having been omitted for clarity of illustration;

FIG. 5 is a top plan view of the surface of a third or intermediate stratum of semi-insulating material on which circuit components and interconnections within the stratum have been formed;

FIG. *5a* is a sectional view of the wafer of FIG. 5 taken through the Line *5a—5a*, certain parts not along Line *5a—5a* having been omitted for clarity of illustration, and showing the vertical relation of the circuit components in the block at the stage of completion illustrated in FIG. 5;

FIG. 6 is a top plan view of the surface of a completed three-dimensional monocrystalline unit showing the circuit components formed in the final upper stratum;

FIG. *6a* is a sectional view of the completed monocrystalline unit taken through the Line *6a—6a*, certain parts not along Line *6a—6a* having been omitted for clarity of illustration; and FIG. 7 is an exploded perspective view of the completed monocrystalline unit of FIG. 6 showing an imaginary separation of the integrally formed strata of the block for clarity of illustration, the bottom layer 21 being broken away and shown in broken lines and the circuit components adjacent the bottom surface being shown in solid lines for clarity of illustration.

Similar reference characters indicate corresponding parts throughout the several views of the drawings.

Dimensions of certain of the parts as shown in the drawings have been modified and/or exaggerated for the purpose of clarity of illustration.

As an exemplary embodiment of the principles of this invention, a single monocrystalline unit is shown and described below. This unit comprises semi-insulating gallium arsenide (GaAc) electrically isolating but physically containing integrally formed strata of semiconductor circuit components. This exemplary unit could contain all of the elements of a complete unitary circuit, for example, an amplifier, a counting circuit, or even a complete system of circuits including display. All interconnections and components of the unit are fabricated and disposed entirely within the confines of the monocrystalline unit or block. The particular arrangement of the circuit components illustrated in the drawings forms no part of this invention.

An advantage of another aspect of the invention, as will become clear from the ensuing description, is that various circuit function-performing regions can advantageously be formed of a variety of materials different from that of the semi-insulating block or integrated circuit substrate wafer. This affords versatility and wide design choices by permitting selection of component-performing regions from a wide variety of differing and varying semiconductor materials. This advantage applies not only to the three-dimensional electronic block but also to the two-dimensional presently known type of integrated circuit.

It is to be understood that the component arrangements schematically shown in detail in the drawings is representative of the highly sophisticated circuit arrangements which may be produced in accordance with this invention. However, the invention is also applicable to the production of less sophisticated devices. The invention is also applicable to hybrid devices, wherein one or more discrete components are attached to one or both sides of a substrate (in contrast to being formed with integral unit strata) and interconnected by conductive means extending through the substrate, or wherein some of the circuit components are discrete thin-film components and others are semiconductor components.

It will be further understood that the specific preferred embodiment of the three-dimensional electronic block is described as gallium arsenide and monocrystalline for illustration and not limitation. The block in some arrangements and combinations of materials may be polycrystalline and be formed of materials other than gallium arsenide.

Figure 1:
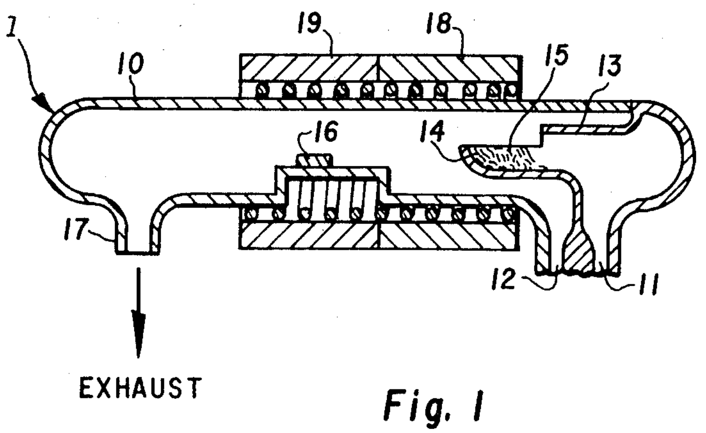
FIG. 1 is an elevational view in section of apparatus suitable for epitaxial deposition of semiconducting and semi-insulating material useful in making the electrical devices of this invention.

Referring now to FIG. 1, there is shown suitable apparatus for the epitaxial deposition of semiconducting or semi-insulating gallium arsenide for producing the electrical devices of this invention. The apparatus, indicated generally at numeral 1, comprises an elongated quartz vessel 10 having an inlet 11 for the introduction of a carrier gas, such as a mixture of hydrogen and arsenic trichloride. Within the vessel 10 is a constriction 13 which contains a feed material 14, such as gallium or gallium arsenide. Carrier gas entering through inlet 11 passes directly over the feed material 14 and carries vapors thereof (when suitably heated) into the reaction vessel 10. Additional carrier gas may be introduced into the reaction vessel through inlet 12 to assist or increase the flow of and assure complete reaction of the reactants. Other materials such as, for example, germanium can be epitaxially deposited using the technique and apparatus of FIG. 1 above described with appropriate feed materials and carrier gases (e.g., iodine or HCl) available to those skilled in the art.

The reaction vessel 10 is positioned partially within a suitable furnace having two separately controlled heating elements so that the feed material 14 may be independently maintained at any desired temperature within the first zone 18 of the furnace and a substrate wafer 16 may be maintained at another temperature within the second zone 19 of the furnace.

Material produced by the reaction within chamber 10 is epitaxially deposited on the surface of the substrate wafer 16 as a contiguous monocrystalline extension of the crystal lattice of the substrate 16 while the spent gases flow out of the vessel 10 through an exhaust vent 17.

For a more detailed description of the apparatus 1 and method of epitaxial deposition, reference may be had to a copending U.S. patent application Ser. No. 360,539, filed Apr. 17, 1964, in the names of William F. Finch and Edwqrd W. Mehal entitled "METHOD FOR MAKING GRADED COMPOSITION MIXED COMPOUND SEMICONDUCTOR MATERIALS" (TI File 1748) and assigned to the assignee of this application.

Figure 2:
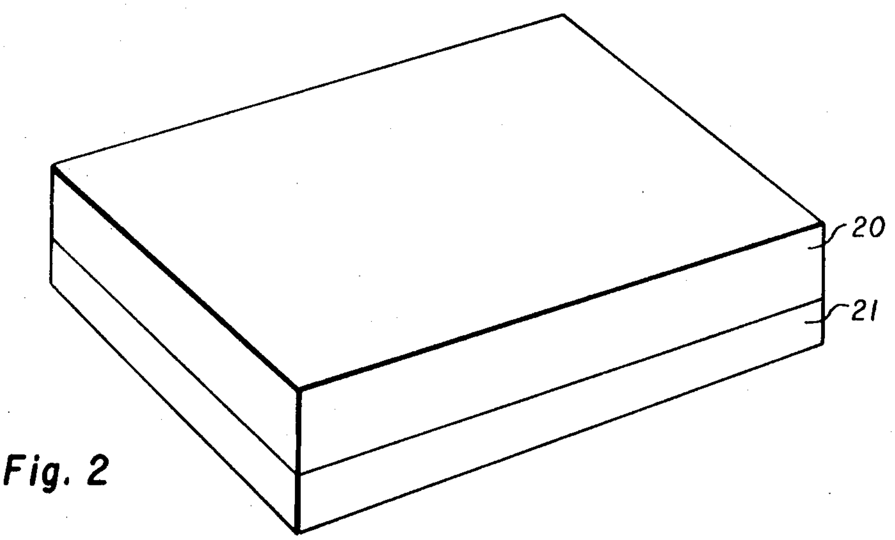
FIG. 2 is a perspective view of a monocrystalline wafer comprising an epitaxially deposited layer of semiconducting material on a semi-insulating substrate forming part of the electronic block to be made in accordance with this invention.

FIG. 2 illustrates a semi-insulating gallium arsenide seed or starting wafer 20 having deposited on one side (i.e., the bottom) thereof a layer of N-type conductivity gallium arsenide 21 by the epitaxial deposition method described with reference to FIG. 1.

Referring to FIG. 3, the exposed surface of the bottom layer 21 is shown. Four areas 22 are depicted schematically showing conventional flip-flop circuits formed by conventional planar diffusion techniques. Four resistors 23 are also formed adjacent or contiguous the surface of the bottom layer 21 (which provides the first stratum) by diffusion through appropriately formed conventional diffusion masks. Thereafter, the appropriate electrical interconnections 24 in the plane of layer 21 having enlarged tabs 25, 26, 27, 28, 29, 30, 31, 32, and 33 are formed adjacent the surface of layer 21 by conventional evaporation of a good conductor, for example, gold, through an appropriate conventional evaporation mask. Since layer 21 is N-type conductivity material, interconnections 24 must be electrically isolated therefrom, for example, by interposing a layer of silicon oxide between interconnections 24 and layer 21, or by appropriate isolation diffusion. Alternatively, resistors 23 and interconnections 24 may be formed by selectively removing part of the bottom layer 21 leaving only the desired defined areas of electrical components.

Except for tabs 25–33, bottom layer 21, as thus far described, is representative of conventional two-dimensional integrated circuit fabricated on one surface of a single substrate wafer. In accordance with this invention, the tabs 25–33 are positioned on the wafer surface in selected positions for electrical interconnections with circuit components formed on the opposite side of the substrate wafer 20 and in other strata to be formed thereon as will be more fully described below.

External electrical circuit connections may be made into the flip-flop circuits. The entire surface of the bottom layer 21 is thereafter covered with a protective coating, such as, for example, reactively sputtered silicon oxide, to prevent further deposition of material on the bottom surface during subsequent fabrication steps.

The top surface of the substrate wafer (opposite layer 21 in FIG. 2) is then coated with a layer of silicon oxide or any other suitable mask (e.g., a diffusion or deposition mask).

Using conventional photoresistive and etching techniques, windows of the desired shape and size of resistors 40 (FIG. 4) are cut into the silicon oxide mask layer. Resistors 40 are then epitaxially deposited or grown on the upper surface of the seed wafer 20 through the windows using the method of epitaxial deposition described above with reference to FIG. 1. For the resistors, the feed material 14 may be gallium or gallium arsenide doped to provide an epitaxial deposit of the desired resistivity. To form the resistors, the assembly shown in FIG. 3 with the silicon oxide mask and resistor windows formed therein, is placed in the reaction vessel 10. This assembly corresponds to wafer 16 of FIG. 1. It will be understood that the resulting epitaxially grown gallium arsenide deposits on the seed wafer 20 only on the exposed resistor pattern surface not covered by the mask and exposed through the mask windows. Alternatively, resistors 40 may be formed by selective diffusion of conductivity-affecting impurities into the wafer 20 through the aforesaid windows in the oxide mask.

Thereafter, another layer of silicon oxide is deposited over the entire top surface of the assembly as thus far completed and a second photoresistive pattern used to form openings in this silicon oxide layer, as well as in the first silicon oxide layer, to delineate interconnecting conductive paths 41 having broadened or enlarged tabs 42–48. Conductive interconnections, such as highly doped, low resistivity germanium or gallium arsenide, may be then deposited on the exposed interconnection pattern on the upper surface of seed wafer 20 to form the interconnecting paths 41. Interconnections 41 may also be formed by diffusion of conductivity-affecting impurities into the wafer 20 through the windows in the silicon oxide layers in amounts sufficient to form high conductivity material in the defined region 41 of the exposed pattern.

A third silicon oxide mask layer is then applied to the entire upper surface of the assembly as thus far formed to cover the previously formed resistors 40, interconnections 41, and tabs 42–48. Thereafter, openings or windows are made at selected locations in the third oxide layer to intersect with selected parts of the conductive pattern circuit function-performing regions thereunder.

Vertically extending low resistivity electrically conductive posts 49 are epitaxially grown on the surfaces of the conductive pattern exposed through the windows in the third oxide mask. As best seen in FIGS. **4*a* and 7, posts 49 extend vertically above the surface of assembly thus far formed to provide electrical interconnections between the circuit function-performing regions of the second stratum (formed on the upper surface of wafer 20) and other circuit function-performing regions in subsequent strata or levels to be formed. Posts 49 are formed by a method similar to that described above with reference to resistors 40. Holes or windows are cut into the silicon oxide mask on the surface of wafer 20 to expose only those component regions or interconnecting paths which are to be electrically connected to circuit function-performing regions in one or more of the next or subsequent strata. Low resistivity gallium arsenide or germanium is then epitaxially deposited on the regions exposed through the windows to form posts 49** which are physically and electrically integrally connected to the surfaces exposed through the windows.

Another method of interconnecting components in superimposed strata which can be used with this invention is shown in FIG. **4*b*.**

Figure 4A:
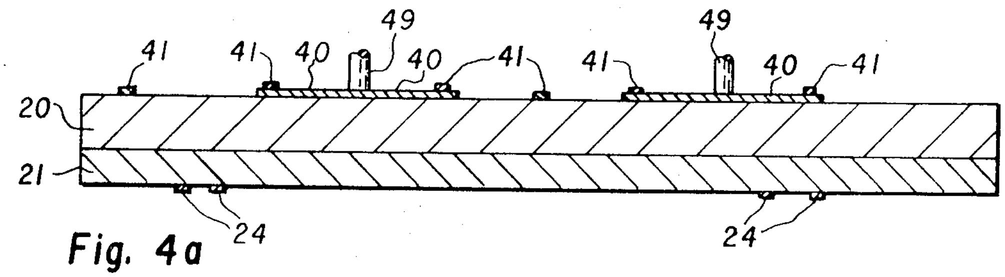
Figure 4B:
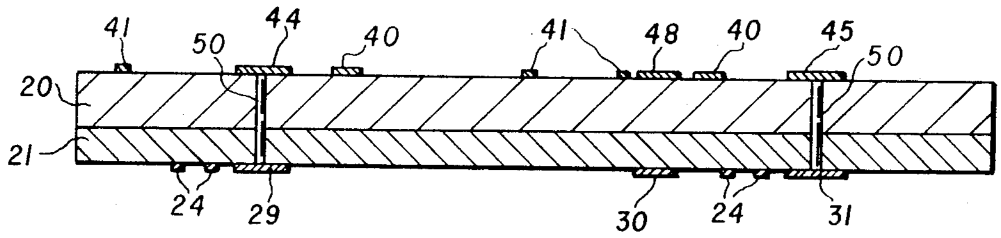

FIG. 4*b* is a sectional view of the wafer of FIG. 4 drawn through the Line 4*b*—4*b* showing the interconnection of tabs 44 and 45 (FIG. 4) with tabs 29 and 31 (FIG. 3), respectively. Tabs 44 and 45 are on the top surface of wafer 20 (the second stratum) and tabs 29 and 31 are on the opposite surface of bottom layer 21 (the first stratum). Connecting electrically conductive pathways extend through both the semi-insulating wafer 20 and bottom layer 21 to effect the electrical interconnections between the tabs. These electrical interconnections may be accomplished by means of holes 50 respectively passing through tabs 31 and 29, bottom layer 21, semi-insulating wafer 20, and tabs 45 and 44. Holes 50 can be formed with a finely focused electron beam which, when focused on tabs 29 and 31, melts and evaporates that portion of the tabs upon which the beam impinges. Likewise, holes 50 are propagated through the entire assembly until the beam emerges through the tabs 44 and 45. The heat generated by the electron beam not only causes the holes 50 to be formed but also causes tabs 29 and 31 to become partially molten. By capillary action, molten gold from tabs 29 and 31 flows respectively through the holes 50 to form an ohmic electrically conductive path connecting tabs 45, 31 and 44, 29. Also by the same technique, electrical connections are made between tabs 25 and 43, 32 and 46, 30 and 48, 28 and 42, and 33 and 47, as shown in FIGS. 3 and 4, respectively.

Figure 5A:
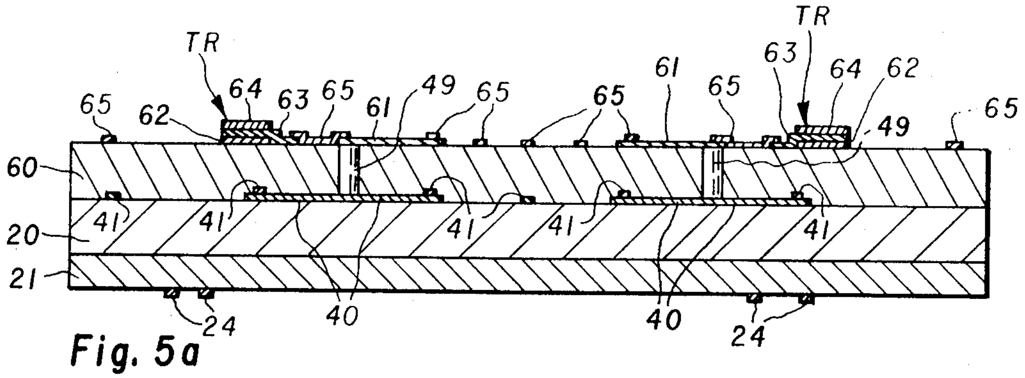

The assembly as thus far completed with the vertical posts 49, as shown in FIG. 4*a*, and the other interconnections, as shown in FIG. 4*b*, is then coated with a layer of silicon oxide deposited over the entire top surface of the second strata of the semi-insulating wafer block 20. By appropriate conventional masking and etching techniques, all silicon oxide coatings are then selectively removed from the top surface of wafer block 20 except that portion of the silicon oxide coating which covers the tops of the vertical interconnection posts 49. The assembly is then positioned in the reactor in the apparatus of FIG. 1 (in the position corresponding to wafer 16 therein) and a layer 60 of semi-insulating gallium arsenide is epitaxially deposited on the exposed top surface of the assembly (see FIG. 5*a*). Layer 60 with layer 20 encapsulates all the components previously formed in the second stratum except the upper surfaces of the vertical interconnection posts 49 which are protected by the layer of silicon oxide. Layers 21, 20, and 60 form a single integral monocrystalline unit as thus far described.

Using silicon oxide films and photoresistive techniques, as described above, resistor patterns are formed on the surface of layer 60 and the resistors 61, as shown in FIG. 5, are deposited in the same manner as described for the resistors 40 in FIG. 4. Likewise, the emitter 62, base 63, and collector 64 for each of the transistors, generally indicated at TR (see FIGS. 5 and 5*a*) are epitaxially deposited through appropriate windows formed in subsequently deposited silicon oxide films in accordance with the methods described above for forming the circuit function-performing means or regions in the second stratum. Interconnecting pathways 65 and enlarged connecting, electrically conductive tabs 67 and 68 are also deposited on the third stratum in the manner described above for the interconnecting paths 41 and tabs 42–48. Thereafter, tab 67 is electrically connected to tab 26 (FIG. 3) and tab 68 is connected to tab 27 by the electron beam process described above for the interconnections between tabs 45, 31 and 44, 29 using holes 51 (see FIG. 5) similar to holes 50 (see FIG. 4*b*). It will be noted that tabs 67 and 68 are on the third stratum while tabs 26 and 27 are on the first stratum and that the circuit arrangement in the second stratum is such as not to deleteriously interfere with the interconnection means passing through the second stratum (in a portion thereof which is electrically insulating) to interconnect tabs 67 and 26 and 68 and 27.

The circuit function-performing means or regions in the third stratum which include the transistors TR, resistors 61 and interconnecting paths 65 are selectively electrically and operatively interconnected with selected ones of the circuit function-performing means or regions of the second stratum by coupling means disposed entirely within the confines of the electronic block. This coupling means takes the form of conductive posts 49 which extend from the second stratum to the third stratum through the integrally formed electrically intrinsic material layer 60. The electrical connection between posts 49 and the selected circuit function-performing regions in the third stratum are made by removing the oxide layers from the top of posts 49 prior to deposition of the circuit function-performing regions of the third stratum. Thus it will be seen that advantageously an electrical interconnection is directly and simultaneously provided at the time the circuit function-performing regions are formed in the third level or stratum. This economically minimizes the number of steps and operations required for fabrication. In the exemplary embodiment illustrated in the drawings, the circuit function-performing regions of the third level or stratum which are directly electrically interconnected with the posts 49 are resistors 61.

Figure 6A:
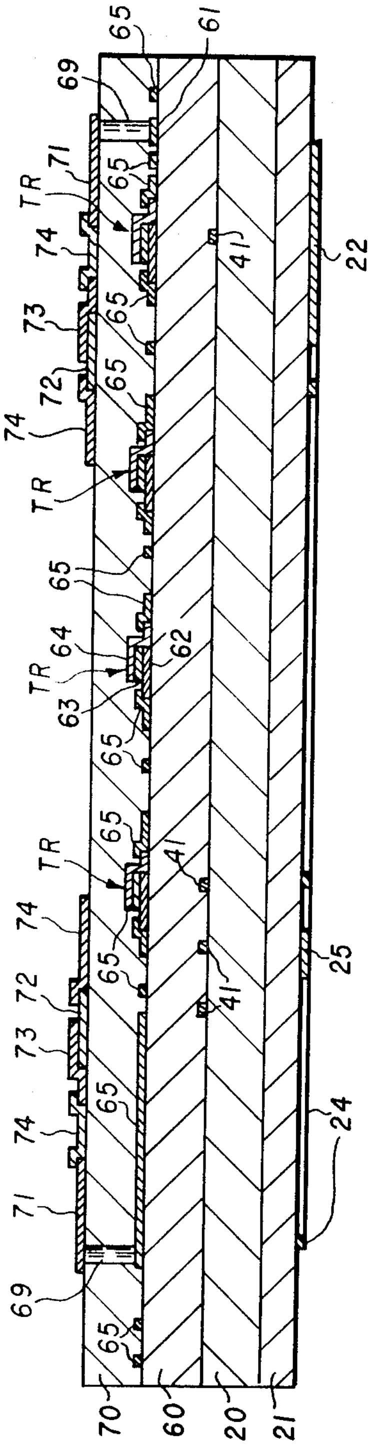

Therefore, vertical interconnection posts 69, similar to posts 49, are deposited on the third stratum and the process described with reference to FIG. 4 is repeated to form or grow another integral layer of semi-insulating gallium arsenide 70 (see FIG. 6*a*) on the surface of layer 60 to encapsulate the circuit function-performing regions of the third stratum and also parts of posts 69. The monocrystalline electronic block now comprises integrally formed layers 70, 60, 20 and 21, as well as the various interconnected circuit function-performing regions of the various levels or strata therein.

The final and fourth stratum of circuit function-performing means or regions of the example illustrated in the drawings is shown in FIG. 6. Using the silicon oxide masking and diffusion techniques, as described above, resistors 71 are formed adjacent the surface of layer 70 such that one end of each resistor 71 respectively contacts and is electrically connected to the top of a respective one of the vertical interconnector posts 69. Thereafter, the anode 72 and cathode 73 of radiant diodes, generally indicated at RD, are epitaxially deposited on and adjacent the surface of layer 70. The radiant diodes, RD in the fourth stratum or level, may be, for example, gallium arsenide diodes such as the types described in the copending application of Biard et al. entitled "SEMICONDUCTOR DEVICE," Ser. No. 215,642, filed Aug. 8, 1962, and assigned to the assignee of the instant application. As a further example, radiant diodes RD may be formed of gallium arsenide-phosphide ($GaAs_xP_{1-x}$) as described in the above referenced application of Finch and Mehal. The phosphorous content of such diodes may be adjusted so that the emitted light is in the visible range.

Thereafter, interconnecting paths 74 having an enlarged tab 75 are formed as hereinbefore described for paths 41. Paths 74 electrically connect all of the various circuit function-performing regions RD and 71 in the fourth level to each other and to other circuit function-performing regions in the third level through vertical interconnecting posts 69 to which paths 74 are also electrically connected as seen in FIG. 6. Tab 75 serves as a connecting point for an external connection, for example, to ground.

It will be understood that while only four levels of strata have been illustrated and described for the exemplary embodiment of the electronic block of this invention, that a greater or lesser number of strata as desired and required by particular applications may be employed within the purview of this invention. Referring to FIG. 7, the various strata are shown in an exploded persepctive view with an imaginary separation of strata and the posts 49 and 69 for clarity of illustration. In FIG. 7 the dashed vertical lines represent the electrical connections between the various circuit function-performing regions of different strata as described above.

Other means of interconnecting circuit function components or regions in different strata may also be used within the purview of this invention. For example, strata bearing components within a single electronic block but mutually electrically isolated by interposed crystalline layers of electrically insulating material (which can be the same as or different from the material of the block) may be interconnected optically by designing the circuit portion in one strata to be activated by illumination of a photosensitive component of another stratum. A radiant diode, for example, aligned with said photosensitive component but electrically isolated therefrom, may be positioned in one stratum adjacent one side of an insulating layer disposed intermediate two strata and activated by a circuit function-performing region in the second stratum located adjacent the oposite of the insulating layer. Thus if the insulating material is transparent to the wavelength of light emitted from the radiation source (i.e., the radiant diode), the circuit portion of the second stratum will respond to and be controlled by radiation from the radiant member of the first stratum.

In this arrangement the circuit function-performing region in the one stratum is responsive to the electrical condition of the radiant diode in the other stratum and the coupling means therebetween in this case is optical, the optical coupling path being disposed entirely within the confines of the electronic block.

In the specific embodiment shown and described above, like components are formed simultaneously in each stratum of the device and alternate layers of electrically intrinsic material used to provide isolation between strata. However, it will be understood that complete circuits may be formed in a single stratum and interconnected with circuit means in a second stratum to build up complete systems within a single unit. Furthermore, the methods described herein may be used in conjunction with other methods of isolation, such as junction isolation, thus vastly expanding the scope of applications for integrated circuits.

The electronic block as described hereinabove utilizes the advantages of three-dimensional circuit arrangements as well as a variation of materials within the block itself, thus providing a further kind of design freedom. It will be seen that this additional design freedom also affords production of improved so-called two-dimensional integrated circuit arrangements having increased effectiveness in performing integrated functions.

It will also be noted that the vertical interconnecting posts may be, for example, germanium and yet be monocrystalline and within the confines of a single block of electrically intrinsic material, e.g., gallium arsenide. By proper selection of materials, function-performing regions within a given or single strata of a unit may be selectively fabricated with materials which best perform the desired function in both a two-dimensional and three-dimensional integrated circuit arrangement. For example, $GaAs_xP_{1-x}$ light emitting diodes may be used in the circuit and the value of $x$ selected so as to produce diodes with the characteristics desired. Such diodes could be produced by the method and apparatus of the aforementioned Finch and Mehal copending application. Likewise, functions best performed by other materials, (such as germanium or silicon,) can be performed by regions of germanium or silicon epitaxially formed on the crystalline lattice of the electrically intrinsic block material and included within a strata of the unit. Thus, for example, a silicon radiation responsive component in one stratum or level may be aligned with a gallium indium arsenide ($Ga_yIn_{(1-y)}As$) radiant component in another stratum or level to provide means for making a circuit or portion thereof of one stratum responsive to the electrical condition of a region within another stratum of the unit. In this case the operative interconnection between those functional regions in the separate levels would be by optical coupling through the block. Furthermore, by judicious selection of appropriate materials, exposed surface components may be fabricated to provide various types of inputs to the circuit or system of the electronic block. Thus, for example, conveniently thermally responsive or radiation responsive components may be formed to provide for versatility of inputs, while still retaining the advantages of the monolithic or integral electronic block concept.

It will be seen from the foregoing that the present invention provides for greater miniaturization of integrated circuits or microelectronics by affording the provision of an electronic block having at different strata (or levels therein), various arrays of electronic components or electronic function-performing regions which are selectively electrically interconnected with components in the same level and with those of other levels or strata within the block. The interconnections between the components at different levels or strata are advantageously made and disposed entirely within the confines of the electronic block thus permitting high packing densities of component functions and interconnections. This feature ideally lends itself to the ever increasing technological demands for greater miniaturization.

In view of the above, it will be seen that the several objects of the invention are achieved, and other advantageous results attained.

As many changes could be made in the above constructions and methods without departing from the scope of the invention, it is intended that all matter contained in the above description or shown in the accompanying drawings, shall be interpreted as illustrative and not in a limiting sense, and it is also intended that the appended claims shall cover all such equivalent variations as come within the true spirit and scope of the invention.

What is claimed is:

1. An integrated circuit having a plurality of circuit components disposed within spaced separate levels within the crystal lattice of a wafer of electrically insulating material comprising:

a. a first plurality of circuit components integrated in a predetermined pattern upon one surface of an electrically insulating substrate and completely contained in a first stratum thereof;

b. at least one monocrystalline electrically conductive interconnection post having the same crystal lattice structure as said wafer, one part of said post being connected to selected ones of said first plurality of circuit components and extending transversely to and away from said one surface of said substrate;

c. an epitaxial layer of electrically insulating material formed on said one surface of said substrate to encapsulate each of said first plurality of circuit components and said post, part of said post remaining exposed for electrical contact; and d. a second plurality of circuit components adjacent the surface of said epitaxial layer and completely contained in a second stratum and electrically isolated from said first stratum, preselected ones of said second plurality of components being electrically connected to exposed parts of said at least one post to electrically interconnect selected components in said first stratum with selected regions in said second stratum.

2. An integrated circuit as set forth in claim 1 wherein said electrically insulating material is gallium arsenide having a resistivity of at least $10^4$ ohm-centimeters at room temperature.

3. An integrated circuit having a plurality of circuit components disposed within spaced separate levels within the crystalline lattice of a wafer of electrically insulating material comprising:

a. a first plurality of circuit components adjacent a first side of an electrically insulating substrate;

b. a second plurality of circuit components adjacent a second side of said electrically insulating substrate;

c. an epitaxial layer of electrically insulating semiconductor material on said second side and said second plurality of components thereon, said epitaxial layer encapsulating said second componets within the crystalline lattice of said epitaxial layer;

d. a third plurality of circuit componets adjacent the surface of said epitaxial layer and completely contained therein; and e. interconnection means for electrically connecting selected ones of said third plurality of components adjacent the surface of said epitaxial layer with said first components adjacent said first side of said substrate and selected ones of said second components adjacent said second side of said substrate.

4. An integrated circuit as set forth in claim 3 wherein said interconnection means has the same crystal lattice structure as said substrate and comprises low resistance paths extending through said insulating epitaxial layer and substrate, said low resistance paths being formed by the introduction of conductivity affecting impurities into said epitaxial layer and substrate.

5. An integrated circuit as set forth in claim 3 wherein said interconnection means comprises a monocrystalline electrically conductive interconnection post having the same crystalline lattice structure as said substrate and extending transversely through said epitaxial layer of electrically insulating material.

6. An integrated circuit having a plurality of circuit components disposed within spaced separate levels within the crystalline lattice of a wafer of semiconductor material comprising:

a. a first plurality of circuit components adjacent one surface of a wafer of semiconductor material, said components being electrically isolated from each other;

b. an epitaxial layer of semiconductor material covering said one surface and first components thereon to inlcude said first components within the crystalline lattice of a single unit of a semiconductor material, a second plurality of circuit components being formed adjacent the surface of said epitaxial layer and completely enclosed therein and electrically isolated from said first plurality of components; and c. interconnection means for connecting selected portions of said second components adjacent the surface of said epitaxial layer with said one surface of said semiconductor material, said interconnection means being electrically isolated from said epitaxial layer.

7. An integrated circuit having a plurality of circuit components disposed within spaced separate levels within the crystalline lattice of a wafer of electrically insulating material comprising:

a. a first plurality of circuit components adjacent a first side of an electrically insulating substrate;

b. a second plurality of circuit components adjacent a second side of said electrically insulating substrate, said second plurality of components including means responsive to radiation of a predetermined wavelength;

c. an epitaxial layer of electrically insulating semiconductor material on said second side and said second plurality of components thereon, said epitaxial layer encapsulating said second components within the crystalline lattice of said epitaxial layer, said epitaxial layer being substantially transparent to radiation of said predetermined wavelength; and d. a third plurality of circuit components adjacent the surface of said epitaxial layer and completely contained therein, said third plurality including means for generating radiation having said predetermined wavelength, whereby selected components of said second plurality are operatively responsive to the radiation emitted by selected components of said third plurality.

* * * * *